United States Patent [19]
Tseng

[11] Patent Number: 5,744,387
[45] Date of Patent: Apr. 28, 1998

[54] METHOD FOR FABRICATING DYNAMIC RANDOM ACCESS MEMORY WITH A FLAT TOPOGRAPHY AND FEWER PHOTOMASKS

[75] Inventor: Horng-Huei Tseng, Hsinchu, Taiwan

[73] Assignee: Vanguard International Semiconductor Corporation, Hsin-Chu, Taiwan

[21] Appl. No.: 813,722

[22] Filed: Mar. 7, 1997

[51] Int. Cl.⁶ ........................................... H01L 21/8242
[52] U.S. Cl. .................... 438/253; 438/239; 438/240; 438/255; 438/396; 438/398
[58] Field of Search .................................. 438/253, 239, 438/240, 255, 396, 398

[56] References Cited

U.S. PATENT DOCUMENTS

| | | | |
|---|---|---|---|
| 5,279,989 | 1/1994 | Kim | 438/396 |
| 5,393,688 | 2/1995 | Motonami et al. | 438/396 |
| 5,498,561 | 3/1996 | Sakuma et al. | 438/396 |
| 5,504,041 | 4/1996 | Summerfelt | 438/396 |
| 5,534,458 | 7/1996 | Okudaira et al. | 438/253 |
| 5,545,584 | 8/1996 | Wieu et al. | 437/52 |
| 5,610,101 | 3/1997 | Koyama | 438/253 |
| 5,622,893 | 4/1997 | Summerfelt et al. | 438/396 |
| 5,631,188 | 5/1997 | Chang et al. | 438/396 |
| 5,665,628 | 9/1997 | Summerfelt | 438/396 |

Primary Examiner—Charles L. Bowers, Jr.
Assistant Examiner—Lynne A. Gurley
Attorney, Agent, or Firm—George O. Saile; Stephen B. Ackerman

[57] ABSTRACT

A method for making DRAM devices having a flatter topography was achieved. A single masking step is used to concurrently etch bit line and capacitor node contact openings. The method involves forming LDD-FETs in the memory cell areas from a patterned first polysilicon layer. A second insulating layer is deposited and planarized. Bit line and capacitor node contact openings are concurrently etched in the second insulating layer to the FET source/drain contact areas. A second polysilicon layer, a tungsten silicide layer, and a third insulating layer are deposited and patterned to form bit lines extending over and into the bit line contact openings while leaving portions of the second polysilicon layer in the node contact openings to form node contacts. A third patterned polysilicon layer forms the bottom electrodes over the capacitor node contact openings adjacent to the bit lines. A thin interelectrode dielectric layer is formed on the bottom electrodes, and a patterned fourth polysilicon layer forms the capacitor top electrodes adjacent to the bit lines. This provides a flatter topography for the DRAM devices.

21 Claims, 3 Drawing Sheets

METHOD FOR FABRICATING DYNAMIC RANDOM ACCESS MEMORY WITH A FLAT TOPOGRAPHY AND FEWER PHOTOMASKS

BACKGROUND OF THE INVENTION

(1) Field of the Invention

This invention relates to an integrated circuit semiconductor device, and more particularly to a method for fabricating an array of stacked capacitors having a less rough topography and using a single photolithography step to simultaneously form both the bit line contact openings and node contact openings

(2) Description of the Prior Art

Dramatic increases have been made in recent years in the integrated circuit density on the semiconductor chips formed from semiconductor substrates. This increase in circuit density has resulted from the downsizing of the individual semiconductor devices and the resulting increase in device packing density. The reduction in device size has resulted from advances in high resolution photolithography, directional (anisotropic) plasma etching, and other semiconductor technology innovations, such as the use of self-aligning techniques. One such chip experiencing this increase in circuit density is the dynamic random access memory (DRAM) chip.

The circuits on the DRAM chip consist in part of an array of individual DRAM storage cells that store binary data (bits) as electrical charge on a storage capacitor. This information is stored or retrieved from the storage capacitor by means of a pass transistor on each memory cell, and by address and read/write circuits on the periphery of the DRAM chip. The pass transistor is usually a field effect transistor (FET) and the single capacitor in each cell is either formed in the semiconductor substrate as a trench capacitor, or built over the FET in the cell area as a stacked capacitor. In recent years the stacked capacitors have received considerable attention because of the various ways in which they can be formed in a vertical direction over the individual cell areas to increase the capacitance. However, the method of making the stacked capacitors involves more processing steps and, in general, the stacked capacitors have a much rougher topography on the substrate surface over the cell areas. The formation of closely spaced metal lines (high aspect ratio) by directional etching over this rough topography can result in intralevel electrical shorts. This makes it more difficult in subsequent processing to provide reliable interconnections without first providing a more planarized surface over the stacked capacitors. This requires additional processing steps. Therefore it would be advantageous to provide a process for making an array of DRAM cells that have a less rough topography with fewer processing steps.

Wuu in U.S. Pat. No. 5,545,584 describes a method for forming simultaneously contacts on a static random access memory (SRAM) device, but does not describe a method for making simultaneously the bit lines and capacitor node contacts on DRAM chips with a flatter topography. Also, many three-dimensional stacked storage capacitor structures have been reported in the literature for increasing the capacitance, but generally require additional processing steps and lead to a rough topography.

Therefore there is still a need in the industry to provide an improved process for making DRAMs that have fewer processing steps and a better and flatter topography. This reduces manufacturing costs and improves integrated circuit reliability.

SUMMARY OF THE INVENTION

It is a principal object of the present invention to provide an array of dynamic random access memory (DRAM) cells having stacked capacitors with a flatter topography.

It is another object of the present invention to fabricate these stacked capacitors using a single photoresist mask to form simultaneously the bit line contacts and the node contacts for each of the DRAM cells, thereby reducing the number of processing steps.

The method for this invention starts by providing an array of device areas on a semiconductor substrate, such as on a silicon substrate having a <100> crystallographic orientation, and doped with a P-type conductive dopant (e.g., boron). The device areas are provided by forming a relatively thick Field OXide (FOX) that surrounds and electrically isolates each device area. One conventional method of forming the field oxide areas is by covering the device areas with a patterned silicon nitride (Si3N4) layer to prevent thermal oxidation. The exposed silicon areas on the substrate are then thermally oxidized to form field oxide areas on the substrate. This method of forming the FOX is commonly referred to as the LOCal Oxidation of Silicon (LOCOS). After removing the silicon nitride layer, a thin gate oxide is formed on the device areas. A first polysilicon layer is deposited and is heavily N+ doped and patterned to form gate electrodes over the device areas. The gate electrodes can also be formed from a polycide layer (polysilicon/silicide) to improve electrical conductivity by forming a silicide on the first polysilicon layer prior to patterning. The patterned first polysilicon layer is also used to concurrently form the word lines over the field oxide regions. Next N– doped lightly doped source/drain areas are formed adjacent to the gate electrodes by ion implantation of a conductive impurity such as arsenic (As75). A conformal first insulating layer is deposited and anisotropically etched back to form insulating sidewall spacers on the gate electrodes. Source/drain contact areas are now formed by ion implanting an N+ type dopant, such as As75, adjacent to the sidewall spacers. This completes the array of FETs used to form the array of switching transistors in the DRAM cells. A second insulating layer, preferably composed of a chemical vapor deposited (CVD) silicon oxide is deposited over the array of FETs and elsewhere on the substrate and is then planarized, for example by chemical/mechanical polishing (CMP). One key feature of this invention is the next step. Source/drain contact openings are anisotropically etched in the second insulating layer to concurrently form both the bit line contact openings and capacitor node contact openings. This step reduces the number of photomask steps over the more conventional method which uses separate masking steps to form both contacts. A second polysilicon layer is then deposited and in-situ doped with an N+ dopant to fill both the bit line contact openings and the capacitor node contact openings and make electrical contacts to the source/drain contact areas of the FETs. The second polysilicon layer is then partially etched back, for example using reactive ion etching (RIE), for a predetermined time thereby providing an essentially planar surface. A silicide layer is now deposited on the second polysilicon layer to improve the electrical conductivity. For example, the silicide can be a tungsten silicide (WSi2). A third insulating layer, such as a CVD silicon oxide (SiO2) formed using tetraethosiloxane (TEOS) as a reactant gas, is deposited on the silicide layer. The third insulating layer, the silicide layer, and the remaining second polysilicon layer are patterned to form the dynamic random access memory (DRAM) bit lines over the bit line contact openings. Concurrently the second polysilicon layer is etched back to the surface of the second insulating layer leaving portions of the N+ doped second polysilicon layer in the capacitor node contact openings thereby forming capacitor node contacts. A conformal fourth insulating layer, such as a TEOS SiO2, is deposited and blanket etched back anisotropically to the surface of the second insulating layer, thereby forming sidewall spacers on the bit lines. The bottom electrodes for the capacitors are now formed by depositing a heavily doped (N+) blanket third polysilicon layer on the second insulating layer. The third polysilicon layer makes electrical contact to the N+ second polysilicon layer in the capacitor node contacts. The third polysilicon layer is then patterned leaving portions over the capacitor node contacts adjacent to the bit lines to form an array of capacitor bottom electrodes for the DRAMs. A thin inter-electrode dielectric layer is then formed over the capacitor bottom electrodes, and a heavily N+ doped blanket fourth polysilicon layer is deposited and patterned over the capacitor bottom electrodes to form the top electrodes for the capacitors. Now by the method of this invention, the vertical heights of the third polysilicon layer and the fourth polysilicon layer making up the stacked capacitor, on the second insulating layer, can be made about equal to the height of the bit lines, thereby forming on the DRAM chip a flatter topography. This flatter topography provides an improved surface on which the next level of integration, such as electrical interconnections, can be formed.

BRIEF DESCRIPTION OF THE DRAWINGS

The objects and advantages of this invention are best understood with reference to the attached drawings in the figures and the embodiment that follows.

DESCRIPTION OF THE PREFERRED EMBODIMENT

Now with reference to FIGS. 1 through 6 and in keeping with the objects of this invention, a detailed embodiment is described for making DRAM cells and bit lines having a much improved topography. The DRAM cell is typically formed on a P-doped semiconductor substrate using N-channel field effect transistor (N-FET) structures as the pass transistor in each of the DRAM cells. It should also be well understood by one skilled in the art that by including additional process steps, in addition to those described in this embodiment, other types of devices can also be included on the DRAM chip, for example, by forming N-well regions in the P-doped substrate, P-channel FETs can also be provided from which Complementary Metal-Oxide-Semiconductor (CMOS) circuits can also be formed, such as are used for the peripheral circuits on the DRAM chip.

Figure 1:
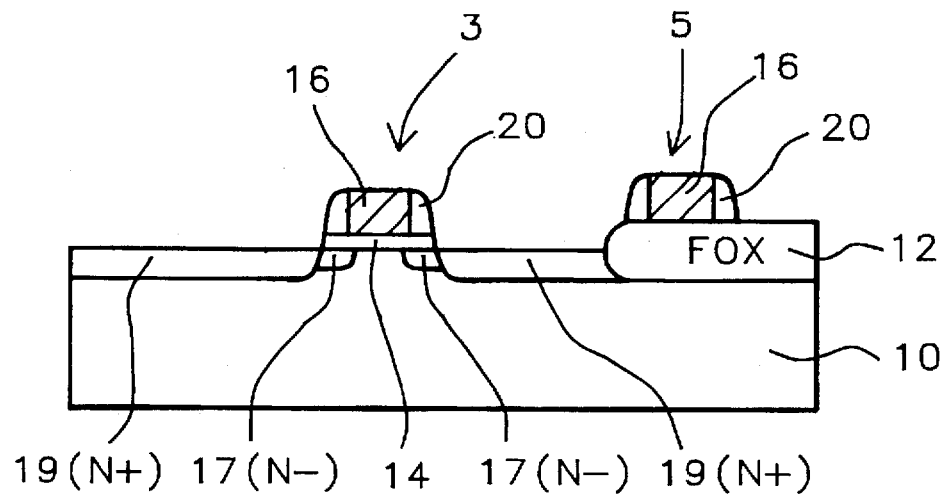
FIGS. 1 through 6 show schematic cross-sectional views for one of the cell regions of an array of DRAM cells illustrating the fabrication steps for a DRAM cell having a stacked storage capacitor and bit line structure with a much improved topography.

Referring now to FIG. 1, a schematic cross-sectional view is shown of a portion of a semiconductor substrate 10 having a partially completed DRAM cell. Shown is a pass transistor (N-channel FET) formed on and in the substrate surface. The preferred substrate is composed of a lightly doped P-type single crystal silicon, preferably having a <100> crystallographic orientation. A relatively thick Field OXide (FOX) 12 is formed surrounding and electrically isolating the individual device regions in which the memory cells are built. The field oxide 12, only partially shown in FIG. 1, is most commonly formed by the LOCal Oxidation of Silicon (LOCOS) method. The detailed process for forming the FOX is not shown in FIG. 1, but briefly the process consists of depositing a thin silicon oxide (pad oxide) and a thicker silicon nitride layer as an oxidation barrier layer on the substrate surface. Conventional photolithographic techniques and etching are used to remove the barrier layer in areas where a field oxide 12 is desired, while retaining the silicon nitride over the device areas. The silicon substrate 10 is then subjected to a thermal oxidation to form the field oxide areas 12. The FOX is usually grown to a thickness in the range of between about 2000 and 6000 Angstroms.

The semiconductor devices (N-channel FETs or N-FETs) are now formed in the active device regions after removing the silicon nitride barrier layer and pad oxide in a wet etch. For example, the nitride can be removed in a hot phosphoric acid (H3PO4) etch at about 180° C., and a pad oxide can be removed in a dilute solution of hydrofluoric acid and water (HF/H20). A thin gate oxide 14 for the N-FETs is formed next in the device areas by thermally oxidizing the active device regions as shown in FIG.1. Typically the thickness of the gate oxide 14 is between about 50 and 150 Angstroms.

Referring still to FIG. 1, a first polysilicon layer 16 is deposited using low pressure chemical vapor deposition (LPCVD). The preferred thickness of the first polysilicon layer 16 is between about 2000 and 3500 Angstroms. Layer 16 is then heavily doped N+ by ion implantation using either phosphorus or arsenic ions to provide a final dopant concentration of between about 1.0 E 20 and 1.0 E 21 atoms/cm3. Alternatively layer 16 can have a silicide, such as tungsten silicide (WSi2), layer formed on the top surface to improve the electrical conductivity and circuit performance. The silicide layer is not shown in the Figs. to simplify the drawings and the discussion. Layer 16 is then patterned using conventional photo-lithographic techniques and anisotropic plasma etching to form the FET gate electrodes 3 in the device areas and the interconnecting word lines 5 over the FOX 12. Lightly doped source/drain areas 17 are formed next adjacent to the gate electrodes 3 by ion implanting an N type impurity, such as arsenic (As75) or phosphorus (P31) ions, to provide lightly doped drains for the FETs. For example, the N-doped source/drain areas can be formed by implanting P31 at a dose of between about 1.0 E 13 and 1.0 E 14 atoms/cm2 and at an ion energy of between about 20 and 40 KeV. The gate electrodes provide a masking effect so that the lightly doped source/drain areas 17 are self-aligned to the gate electrodes, while an additional photoresist mask can be used to prevent implanting in other areas of the substrate where the implant is not desired.

Continuing with FIG. 1, a conformal first insulating layer 20 is deposited and anisotropically etched back to form insulating sidewall spacers 20 on the gate electrodes 3 that are also concurrently formed on the interconnecting word lines 5. Preferably the first insulating layer 20 is a low-temperature silicon oxide deposited by CVD using a reactant gas such as tetraethoxysilane (TEOS) at a temperature in the range of between about 650 and 900° C. The sidewall spacers are then formed by anisotropic plasma etching. For example, the etch back of layer 20 can be achieved by reactive ion etching (RIE). After completing the sidewall spacers 20, heavily N+ doped source/drain contact areas 19 are now formed adjacent to the sidewall spacers. The N+ source/drain contact areas are formed by ion implanting an N+ type dopant, such as As75. Typically the source/drain contact areas are implanted to achieve a dopant concentration of between about 1.0 E 20 and 1.0 E 21 atoms/cm3. This completes the array of FETs used to form the array of switching transistors in the DRAM cells.

Figure 2:
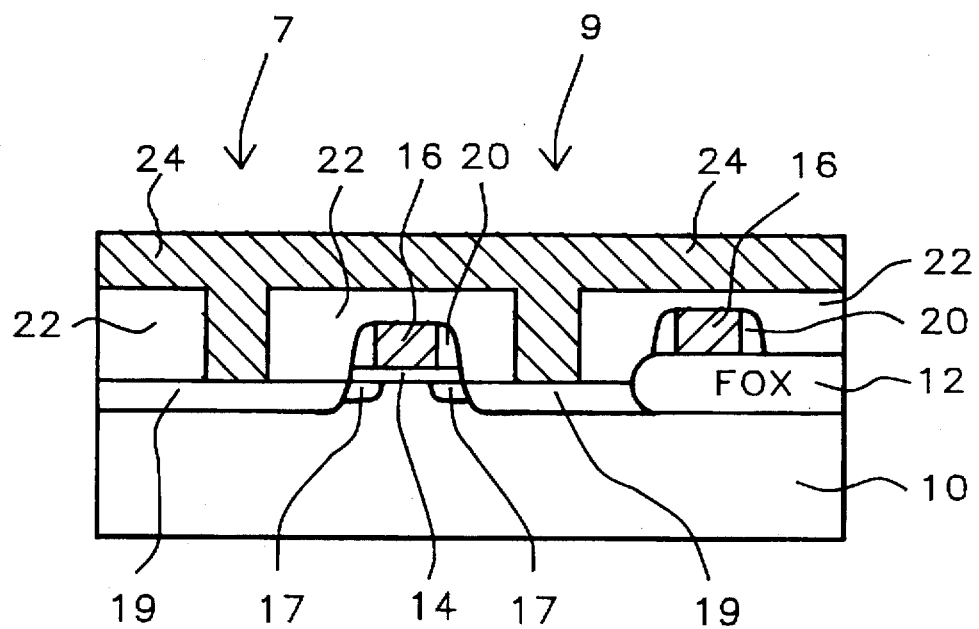

Referring now to FIG. 2, a second insulating layer 22 is deposited over the array of FETs and elsewhere on the substrate to electrically insulate the devices from the next level of interconnections and from the stacked capacitors that are formed next. Preferably layer 22 is a chemical vapor deposited (CVD) silicon oxide. For example layer 22 can be deposited by low pressure CVD using TEOS as the reactant gas. The second insulating layer 22 is deposited to a thickness of between about 4000 and 8000 Angstroms. Layer 22 is then planarized by chemical/mechanical polishing (CMP) to provide global planarization across the substrate. A key feature of the invention is to concurrently etch in layer 22 to the source/drain contact areas the bit line contact openings 7 and the node contact openings 9 for the stacked capacitors.

This reduces the number of photoresist masking steps over the more conventional method of making DRAMs. Preferably the contact openings 7 and 9 are etched using anisotropic plasma etching. The etching can be carried out in an RIE or high-density plasma etcher using a reactant gas mixture containing trifluoromethane (CHF3) or alternatively a gas mixture of carbon tetrafluoride (CF4) and hydrogen (H2).

Still referring to FIG. 2, a second polysilicon layer 24 is deposited over the second insulating layer 22 and filling the bit line contact openings 7 and the capacitor node contact openings 9 to make electrical contacts to the source/drain contact areas 19 of the FETs. Polysilicon layer 24 is deposited, for example, using LPCVD and a reactant gas such as silane (SiH4). Layer 24 is preferably doped by in-situ doping using, for example, phosphine (PH3) or arsine (AsH3) to a concentration of between about 1.0 E 20 and 1.0 E 21 atoms/cm3. Layer 24 is deposited to a thickness of between about 800 and 2000 Angstroms.

Figure 3:
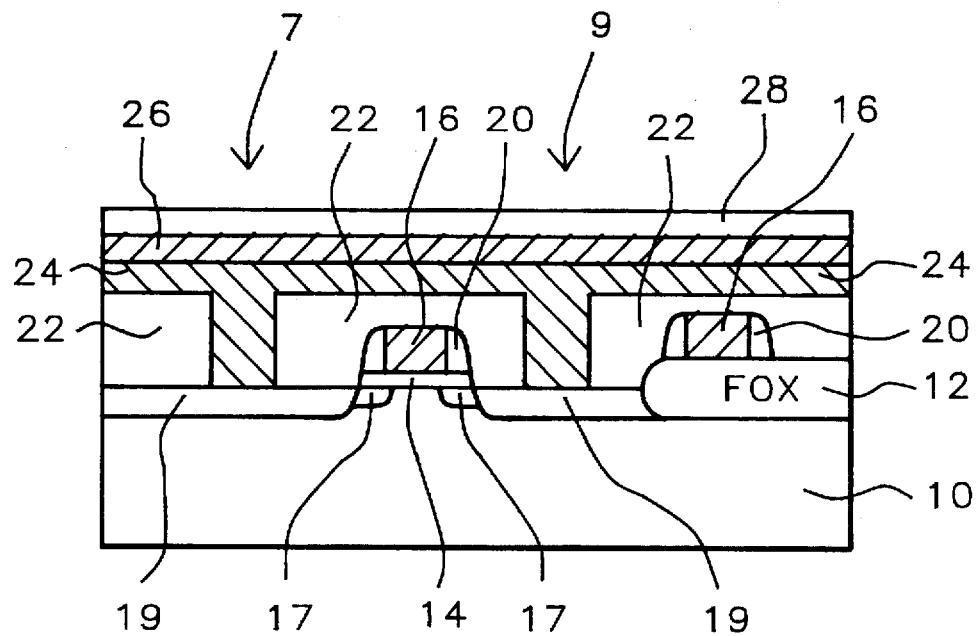

Referring to FIG. 3, the second polysilicon layer 24 is then partially etched back, for example using reactive ion etching (RIE) for a predetermined time, to form an essentially planar surface. The etch back can be carried out in a reactive ion etcher using, for example, a gas mixture containing chlorine. After etch-back the thickness of layer 24 is preferably between about 300 and 1500 Angstroms. To improve the electrical conductivity of layer 24 from which the bit lines will be formed, a silicide layer 26 is deposited on the second polysilicon layer. For example, a tungsten silicide (WSi2) can be used as the silicide layer 26. Preferably the WSi2 is deposited by CVD using a reactant gas, such as tungsten hexafluoride (WF6), and is deposited to a thickness of between about 1000 and 1500 Angstroms. Next, a third insulating layer 28, composed of silicon oxide (SiO2), is deposited over the silicide layer 26. For example, layer 28 can be deposited by CVD using tetraethosiloxane (TEOS) as the reactant gas. The third insulating layer 28 is deposited to a thickness of between about 2000 and 6000 Angstroms.

Figure 4:
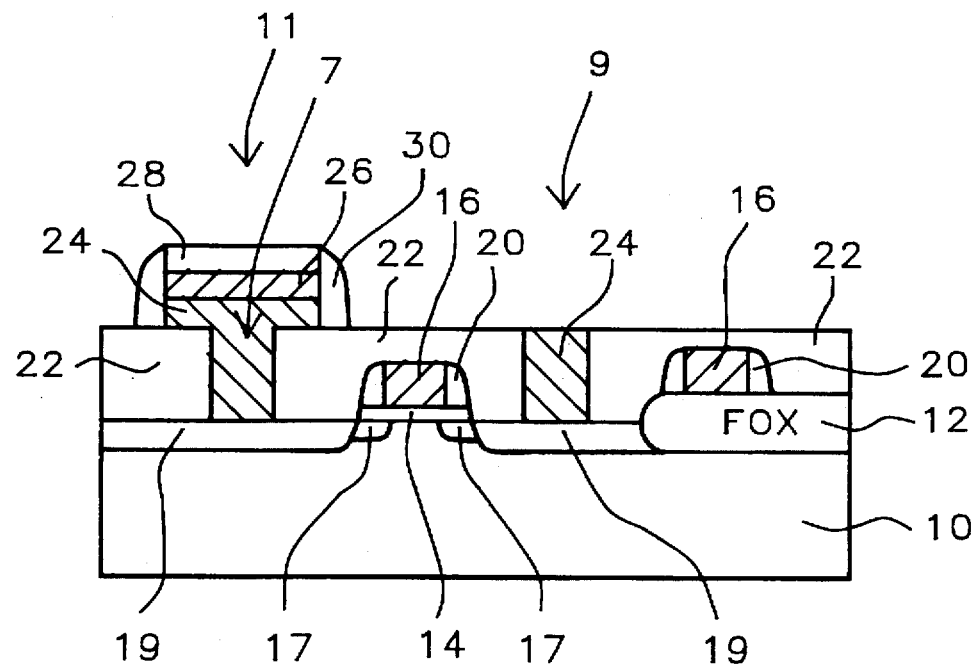

Now as shown in FIG. 4, the third insulating layer 28, the silicide layer 26, and the second polysilicon layer 24 are patterned using conventional photolithographic techniques to form the bit lines 11 for the DRAMs extending over the bit line contact openings 7. The polysilicon layer 24 is etched to the surface of the second insulating layer 22 leaving portions of the heavily N+ doped polysilicon layer 24 in the node contact openings 9 for the stacked capacitors. A conformal fourth insulating layer 30, preferably composed of a TEOS SiO2, is deposited and anisotropically etched back to the surface of the second insulating layer 22, thereby forming sidewall spacers 30 on the bit lines 11.

Figure 5:
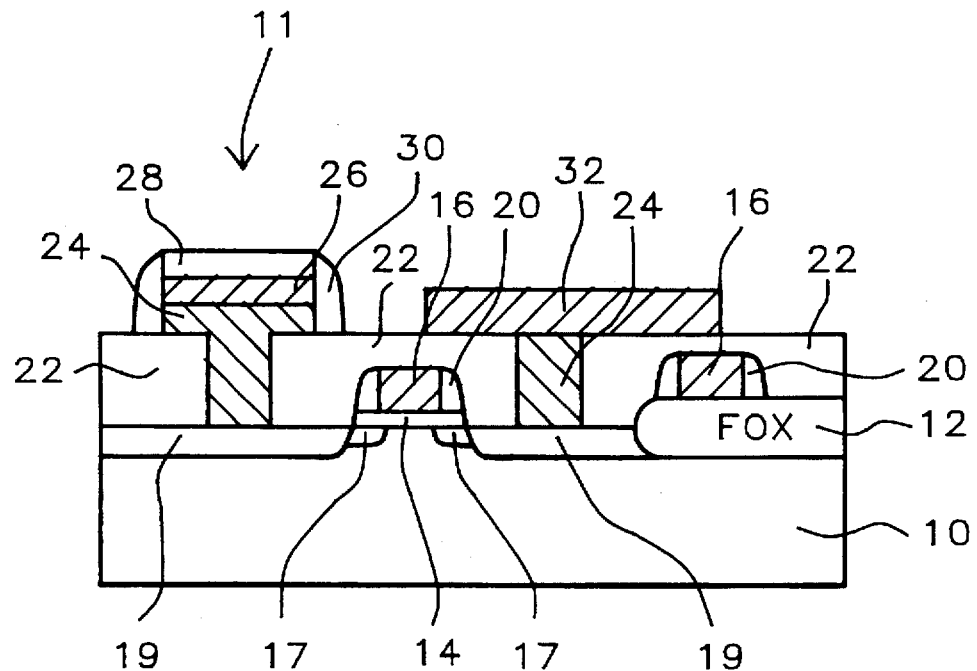
Figure 6:
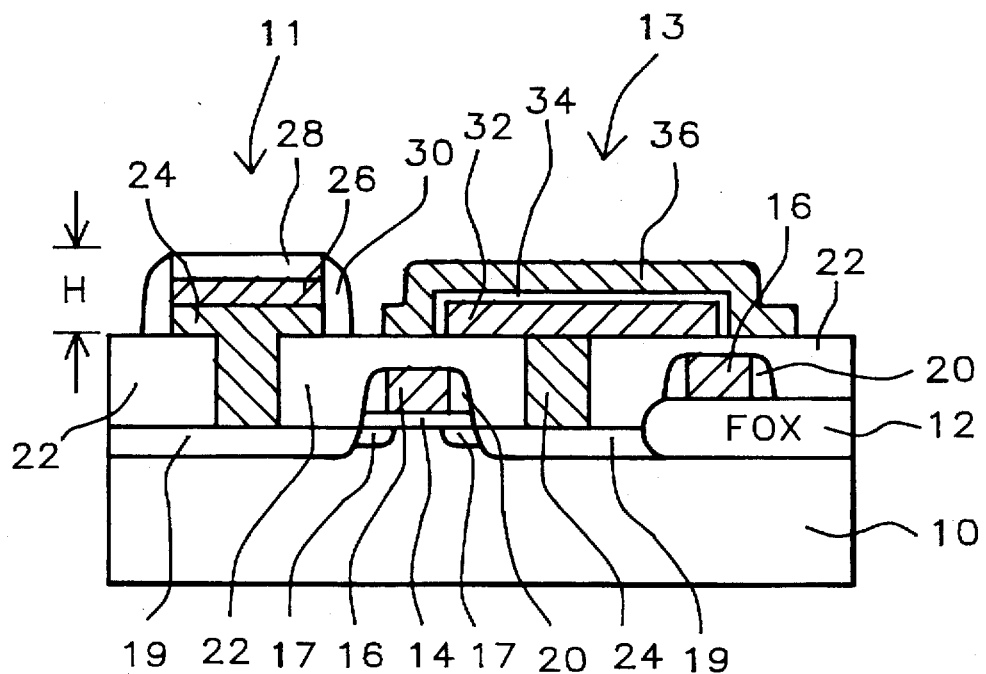

Referring now more specifically to FIGS. 5 and 6, the method is described for making the stacked capacitors having a height over the second insulating layer 22 comparable to the height of the bit lines 11, and therefore providing a more flat topography. As shown in FIG. 5, a third polysilicon layer 32 is deposited and patterned to form the bottom electrodes, also labeled 32, adjacent to the bit lines 11 for the stacked capacitors. The bottom electrodes are formed over the node contact openings 9 containing portions of the N+ doped second polysilicon layer 24 that form the node contacts to the source/drain contact areas 19. Polysilicon layer 32 is preferably deposited by LPCVD to a thickness of between about 4000 and 10000 Angstroms and is preferably doped with phosphorus to a concentration of between about 1.0 E 20 and 1.0 E 21 atoms/cm3, either by ion implantation or in-situ doping.

Referring now to FIG. 6, the stacked capacitors are completed by the following process steps. A thin interelectrode dielectric layer 34, having a high dielectric constant, is formed on the bottom electrodes. For example, layer 34 can be a silicon oxide-silicon nitride-silicon oxide (ONO). Layer 34 can be formed by growing a thin silicon oxide layer, depositing a silicon nitride layer by LPCVD, and then converting the top surface of the nitride layer to a silicon oxide. In addition, the bottom electrodes formed from polysilicon layer 32 can be roughened to further increase the capacitance, for example, by subjecting the layer 32 to a phosphoric acid solution etch. Alternatively, the ONO layer can be replaced by a more exotic dielectric layer, such as tantalum pentoxide (Ta2O5) having a higher dielectric constant. Preferably the thickness of ONO layer 34 is between about 30 and 100 Angstroms.

The stacked capacitors are now completed by depositing a heavily N+ doped blanket fourth polysilicon layer 36. Preferably layer 36 is deposited by LPCVD using, for example, SiH4 as the reactant gas, and is doped with phosphorus by either ion implantation or by in-situ doping. Preferably the dopant concentration is between about 1.0 E 20 and 1.0 E 21 atoms/cm3. Layer 36 is deposited to a thickness of between about 1000 and 2000 Angstroms. More specifically, the fourth polysilicon layer 36 is deposited to a thickness that results in stacked capacitors 13 having a height that, if desired, can be made about equal to the height H of the bit lines 11, thereby forming DRAM structures having a much improved (flatter) topography, as depicted in FIG. 6. Layer 36 is then patterned using conventional photolithographic techniques and anisotropic plasma etching to form the top electrode over the capacitor bottom electrode (layer 32) adjacent to the bit line 11. This flatter topography on the DRAM chip provides a much improved surface for the fabrication of the next level of metal interconnections.

While the invention has been particularly shown and described with reference to the preferred embodiment thereof, it will be understood by those skilled in the art that various changes in form and details may be made without departing from the spirit and scope of the invention.

What is claimed is:

1. A method for fabricating dynamic random access memory (DRAM) having a flat topography on a semiconductor substrate, comprising the steps of:

providing said semiconductor substrate having device areas surrounded and electrically isolated from each other by field oxide areas and further providing field effect transistors having gate electrodes formed from a patterned first polysilicon layer and having sidewall spacers formed from a first insulating layer and having source/drain contact areas adjacent to said gate electrodes in said device areas;

depositing a second insulating layer having a planar surface;

anisotropically etching openings in said second insulating layer to said source/drain contact areas and forming concurrently bit line contact openings and capacitor node contact openings for said field effect transistors;

depositing a second polysilicon layer thereby filling said bit line contact openings and said capacitor node contact openings;

planarizing said second polysilicon layer by partially etching back said second polysilicon layer; forming a silicide layer on said second polysilicon layer;

depositing a third insulating layer on said silicide layer;

forming bit lines extending over said bit line contact openings by patterning said third insulating layer, said silicide layer, and said second polysilicon layer, and concurrently leaving portions of said second polysilicon layer in said capacitor node contact openings, thereby forming capacitor node contacts for capacitors;

depositing a conformal fourth insulating layer and anisotropically etching back to the surface of said second insulating layer thereby forming sidewall spacers on said bit lines;

depositing a blanket third polysilicon layer on said second insulating layer and over and electrically contacting said capacitor node contacts formed from said second polysilicon layer;

patterning said third polysilicon layer leaving portions over said capacitor node contacts and adjacent to said bit lines, thereby forming capacitor bottom electrodes;

forming an interelectrode dielectric layer on said capacitor bottom electrodes;

depositing a blanket fourth polysilicon layer on said interelectrode dielectric layer over said capacitor bottom electrodes and elsewhere on said substrate surface;

patterning said fourth polysilicon layer leaving portions over said capacitor bottom electrodes and adjacent to said bit lines to form top electrodes, thereby forming said DRAM having said flat topography.

2. The method of claim 1, wherein said first polysilicon layer is conductively doped and has a thickness of between about 2000 and 3500 Angstroms.

3. The method of claim 1, wherein said second insulating layer is silicon oxide deposited by chemical vapor deposition (CVD) to a thickness of between about 4000 and 8000 Angstroms.

4. The method of claim 1, wherein said second insulating layer is planarized by chemical/mechanical polishing (CMP).

5. The method of claim 1, wherein said second polysilicon layer is conductively doped and has a thickness after partial etch-back of between about 300 and 1500 Angstroms.

6. The method of claim 1, wherein said silicide layer is composed of tungsten silicide having a thickness of between about 1000 and 1500 Angstroms.

7. The method of claim 1, wherein said third insulating layer has a thickness of between about 2000 and 6000 Angstroms.

8. The method of claim 1, wherein said third polysilicon layer is conductively doped and has a thickness of between about 4000 and 10000 Angstroms.

9. The method of claim 1, wherein said interelectrode dielectric layer is composed of a silicon oxide-silicon nitride-silicon oxide (ONO) and has a thickness of between about 30 and 100 Angstroms.

10. The method of claim 1, wherein said fourth polysilicon layer is conductively doped and has a thickness of between about 1000 and 2000 Angstroms.

11. The method of claim 1, wherein said fourth polysilicon layer over said capacitor bottom electrodes is essentially coplanar with top surface of said bit lines.

12. A method for fabricating dynamic random access memory (DRAM) having a flat topography on a semiconductor substrate, comprising the steps of:

providing said semiconductor substrate having device areas surrounded and electrically isolated from each other by field oxide areas and further providing field effect transistors having gate electrodes formed from a patterned first polysilicon layer and having sidewall spacers formed from a first insulating layer and having source/drain contact areas adjacent to said gate electrodes in said device areas;

depositing a second insulating layer having a planar surface formed by chemical/mechanical polishing;

anisotropically etching openings in said second insulating layer to said source/drain contact areas and forming concurrently bit line contact openings and capacitor node contact openings for said field effect transistors;

depositing a second polysilicon layer thereby filling said bit line contact openings and said capacitor node contact openings;

planarizing said second polysilicon layer by partially etching back said second polysilicon layer;

forming a tungsten silicide layer on said second polysilicon layer; depositing a third insulating layer on said tungsten silicide layer;

forming bit lines extending over said bit line contact openings by patterning said third insulating layer, said tungsten silicide layer, and said second polysilicon layer, and concurrently leaving portions of said second polysilicon layer in said capacitor node contacts openings, thereby forming capacitor node contacts for capacitors;

depositing a conformal fourth insulating layer and anisotropically etching back to the surface of said second insulating layer thereby forming sidewall spacers on said bit lines;

depositing a blanket third polysilicon layer on said second insulating layer and over and electrically contacting said capacitor node contacts formed from said second polysilicon layer;

patterning said third polysilicon layer leaving portions over said capacitor node contacts and adjacent to said bit lines, thereby forming capacitor bottom electrodes;

forming an interelectrode dielectric layer on said capacitor bottom electrodes;

depositing a blanket fourth polysilicon layer on said interelectrode dielectric layer over said capacitor bottom electrodes and elsewhere on said substrate surface;

patterning said fourth polysilicon layer leaving portions over said capacitor bottom electrodes and adjacent to said bit lines and forming top electrodes, thereby forming said DRAM having said flat topography.

13. The method of claim 12, wherein said first polysilicon layer is conductively doped and having a thickness of between about 2000 and 3500 Angstroms.

14. The method of claim 12, wherein said second insulating layer is silicon oxide deposited by chemical vapor deposition.

15. The method of claim 12, wherein said second insulating layer is deposited to a thickness of between about 4000 and 8000 Angstroms.

16. The method of claim 12, wherein said second polysilicon layer is conductively doped and has a thickness after partial etch-back of between about 300 and 1500 Angstroms.

17. The method of claim 12, wherein said tungsten silicide layer has a thickness of between about 1000 and 1500 Angstroms.

18. The method of claim 12, wherein said third insulating layer has a thickness of between about 2000 and 6000 Angstroms.

19. The method of claim 12, wherein said third polysilicon layer is conductively doped and has a thickness of between about 4000 and 10000 Angstroms.

20. The method of claim 12, wherein said interelectrode dielectric layer is composed of a silicon oxide-silicon nitride-silicon oxide (ONO) and has a thickness of between about 30 and 100 Angstroms.

21. The method of claim 12, wherein said fourth polysilicon layer is conductively doped and has a thickness of between about 1000 and 2000 Angstroms, and said fourth polysilicon layer over said capacitor bottom electrodes being essentially coplanar with top surface of said bit lines.

* * * * *